US009345162B2

United States Patent
Fan

(10) Patent No.: US 9,345,162 B2
(45) Date of Patent: May 17, 2016

(54) MOUNTING STRUCTURE FOR CIRCUIT BOARD

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventor: Yong-Chang Fan, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 18 days.

(21) Appl. No.: 14/531,266

(22) Filed: Nov. 3, 2014

(65) Prior Publication Data

US 2015/0189766 A1  Jul. 2, 2015

(30) Foreign Application Priority Data

Dec. 31, 2013 (CN) .......................... 2013 1 0748000

(51) Int. Cl.
*H05K 7/14* (2006.01)
*G06F 1/18* (2006.01)

(52) U.S. Cl.
CPC ................ *H05K 7/1417* (2013.01); *G06F 1/18* (2013.01)

(58) Field of Classification Search
CPC ................................ H05K 7/1417; G06F 1/18
USPC ........... 361/752, 759, 802, 807, 809; 439/545
See application file for complete search history.

(56) References Cited

U.S. PATENT DOCUMENTS

| | | | | |
|---|---|---|---|---|
| 4,198,024 A * | 4/1980 | Cavanna | ................ | F16M 13/00 211/41.17 |
| 4,579,406 A * | 4/1986 | Laursen | ................ | H05K 1/117 361/777 |
| 5,281,149 A * | 1/1994 | Petri | ...................... | H05K 7/142 174/138 D |
| 5,872,701 A * | 2/1999 | Hayden, Sr. | ......... | H05K 7/1454 361/741 |
| 6,000,559 A * | 12/1999 | Stopyra | ................ | H05K 7/1417 211/41.17 |
| 6,327,160 B1 * | 12/2001 | Liao | ........................ | H05K 7/142 24/563 |
| 6,381,149 B1 * | 4/2002 | Megason | ............. | H05K 7/1418 361/756 |
| 6,428,352 B1 * | 8/2002 | Boyden | .................. | H01R 13/74 439/545 |
| 6,752,276 B2 * | 6/2004 | Rumney | ................. | H05K 7/142 211/41.17 |
| 6,865,091 B2 * | 3/2005 | Hsu | ........................ | H05K 7/142 361/747 |

(Continued)

*Primary Examiner* — Adrian S Wilson
*Assistant Examiner* — Abhishek Rathod
(74) *Attorney, Agent, or Firm* — Novak Druce Connolly Bove + Quigg LLP

(57) ABSTRACT

A mounting structure in a power supply chassis includes a mounting portion and a securing portion. The mounting portion is located on a first sidewall of the power supply chassis. The mounting portion includes a first protruding plate for supporting a circuit board, a second protruding plate parallel to the first protruding plate, and a positioning portion to receive the circuit board. The positioning portion is located between the first protruding plate and the second protruding plate. The securing portion includes a resilient portion extending into the positioning portion. When the circuit board is installed in the power supply chassis, the circuit board is received in the positioning portion and supported by the first protruding plate, with the resilient portion engaged in a securing hole defined in the circuit board.

16 Claims, 6 Drawing Sheets

(56) References Cited

U.S. PATENT DOCUMENTS

| | | | | |
|---|---|---|---|---|
| 7,004,764 B2 * | 2/2006 | Boudreau | ............ | H05K 7/142 174/138 G |
| 7,072,176 B2 * | 7/2006 | Lin | ............ | G06F 1/184 174/138 G |
| 7,239,529 B1 * | 7/2007 | Chang | ............ | H05K 7/1431 174/520 |
| 7,554,815 B2 * | 6/2009 | Hardt | ............ | H05K 7/1487 361/742 |
| 8,085,552 B2 * | 12/2011 | Takao | ............ | G06F 1/185 361/807 |
| 8,382,491 B2 * | 2/2013 | Chen | ............ | 439/660 |
| 8,564,971 B2 * | 10/2013 | Sun | ............ | G06F 1/187 174/138 E |
| 2007/0201191 A1 * | 8/2007 | Takahashi | ............ | H05K 7/1417 361/600 |
| 2008/0000850 A1 * | 1/2008 | Peng | ............ | H05K 7/1405 211/41.17 |
| 2009/0067142 A1 * | 3/2009 | Tsai | ............ | H05K 7/1429 361/759 |
| 2009/0147450 A1 * | 6/2009 | Nara | ............ | G06F 1/181 361/679.01 |
| 2011/0310573 A1 * | 12/2011 | Kasahara | ............ | H05K 7/1417 361/752 |
| 2012/0009825 A1 * | 1/2012 | Chen | ............ | H01R 12/7052 439/660 |
| 2013/0120945 A1 * | 5/2013 | Zhao | ............ | H05K 7/142 361/759 |
| 2014/0029214 A1 * | 1/2014 | Lu | ............ | H05K 7/1402 361/752 |

\* cited by examiner

MOUNTING STRUCTURE FOR CIRCUIT BOARD

CROSS-REFERENCE TO RELATED APPLICATIONS

This application claims priority to Chinese Patent Application No. 201310748000.5 filed on Dec. 31, 2013, the contents of which are hereby incorporated by reference.

FIELD

The subject matter herein generally relates to a mounting structure for a circuit board in a power supply, and more particularly to a structure which can be used for quickly mounting and detaching a circuit board.

BACKGROUND

During assembly of a personal computer, a circuit board must be fastened to a computer frame or chassis. The circuit board is conventionally mounted to the computer chassis using fasteners such as screws or bolts. Corresponding positioning holes are defined in the circuit board and the chassis. The fasteners are usually inserted into the positioning holes and tightened one by one, thereby securing the circuit board to the chassis.

BRIEF DESCRIPTION OF THE DRAWINGS

Implementations of the present technology will now be described, by way of example only, with reference to the attached figures.

DETAILED DESCRIPTION

Figure 1:
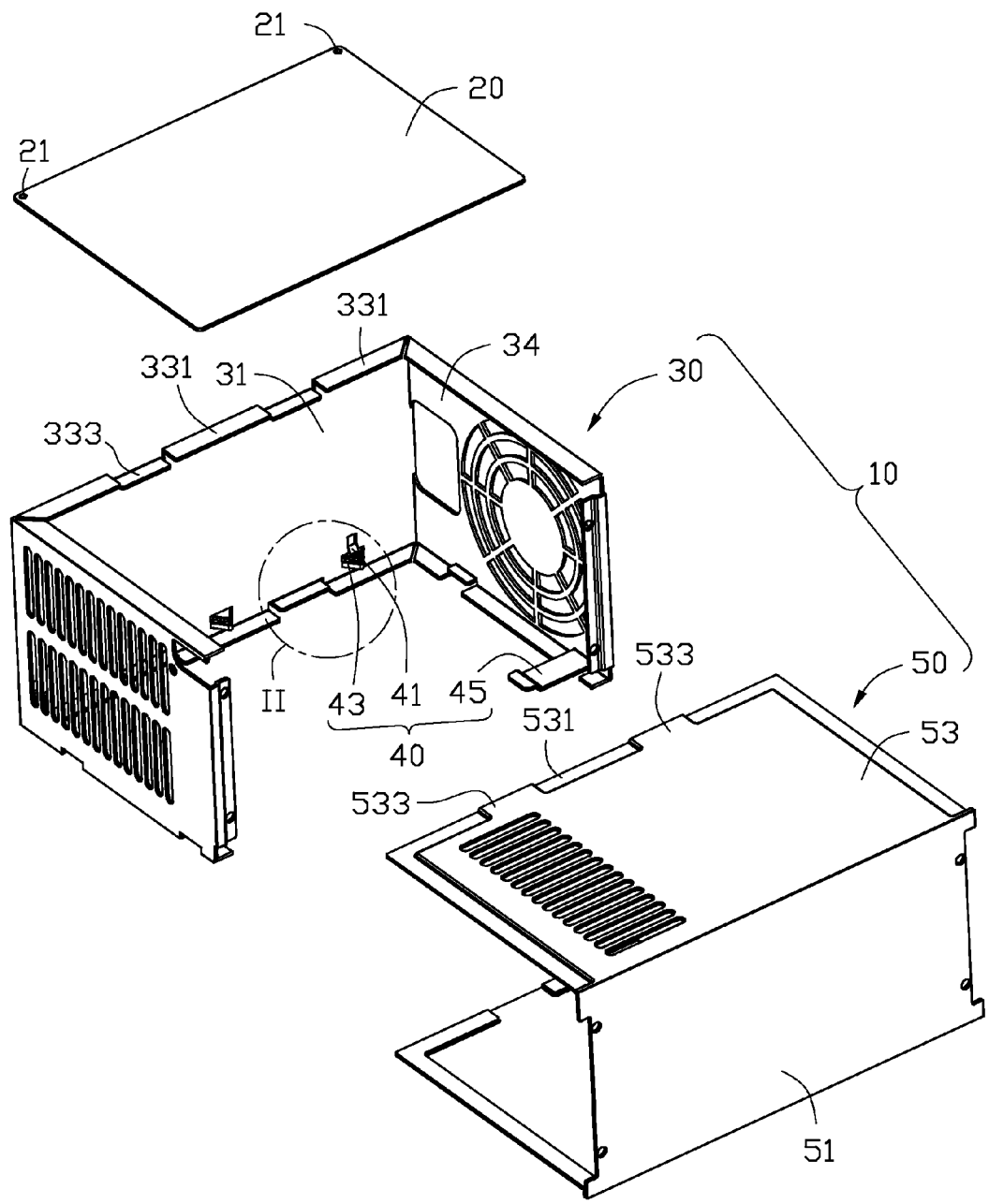
FIG. 1 is an exploded, isometric view of a power supply in accordance with an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

FIG. 1 illustrates an embodiment of a power supply chassis 10 and a circuit board 20 which can be installed in the power supply chassis 10. The power supply chassis 10 can include a first enclosure 30 and a second enclosure 50. The circuit board 20 defines a plurality of securing holes 21.

The first enclosure 30 can include a first sidewall 31 and two second sidewalls 34. The second sidewalls 34 are connected substantially perpendicular to the first sidewall 31. A plurality of first flanges 331 and second flanges 333 are located at one side of the first sidewall 31. Each second flange 333 is located between two first flanges 331. The first flanges 331 and the second flanges 333 are parallel with each other and substantially perpendicular to the first sidewall 31. The first flanges 331 are located on a first horizontal plane, and the second flanges 333 are located on a second horizontal plane. In at least one embodiment, the second horizontal plane is lower than the first horizontal plane in a vertical direction.

A mounting structure 40 for mounting the circuit board 20 is located in the first enclosure 30. The mounting structure 40 can include a mounting portion 41, a securing portion 43, and a retaining piece 45 attached to the second sidewall 34. In at least one embodiment, the retaining piece 45 is substantially perpendicular to the second sidewall 34. The mounting portion 41 and the securing portion 43 are located on the first sidewall 31.

The second enclosure 50 can include a first panel 51 and two second panels 53 perpendicular to the first panel 51. The second panels 53 are connected to the first panel 51. The second panel 53 defines a plurality of upper recesses 531 corresponding to the first flanges 331 and a plurality of lower recesses 533 corresponding to the second flanges 333. The upper recesses 531 and the lower recesses 533 are located adjacent to an edge of the second panel 53. The upper recess 531 can receive the first flange 331, and the lower recess 533 can receive the second flange 333.

Figure 2:
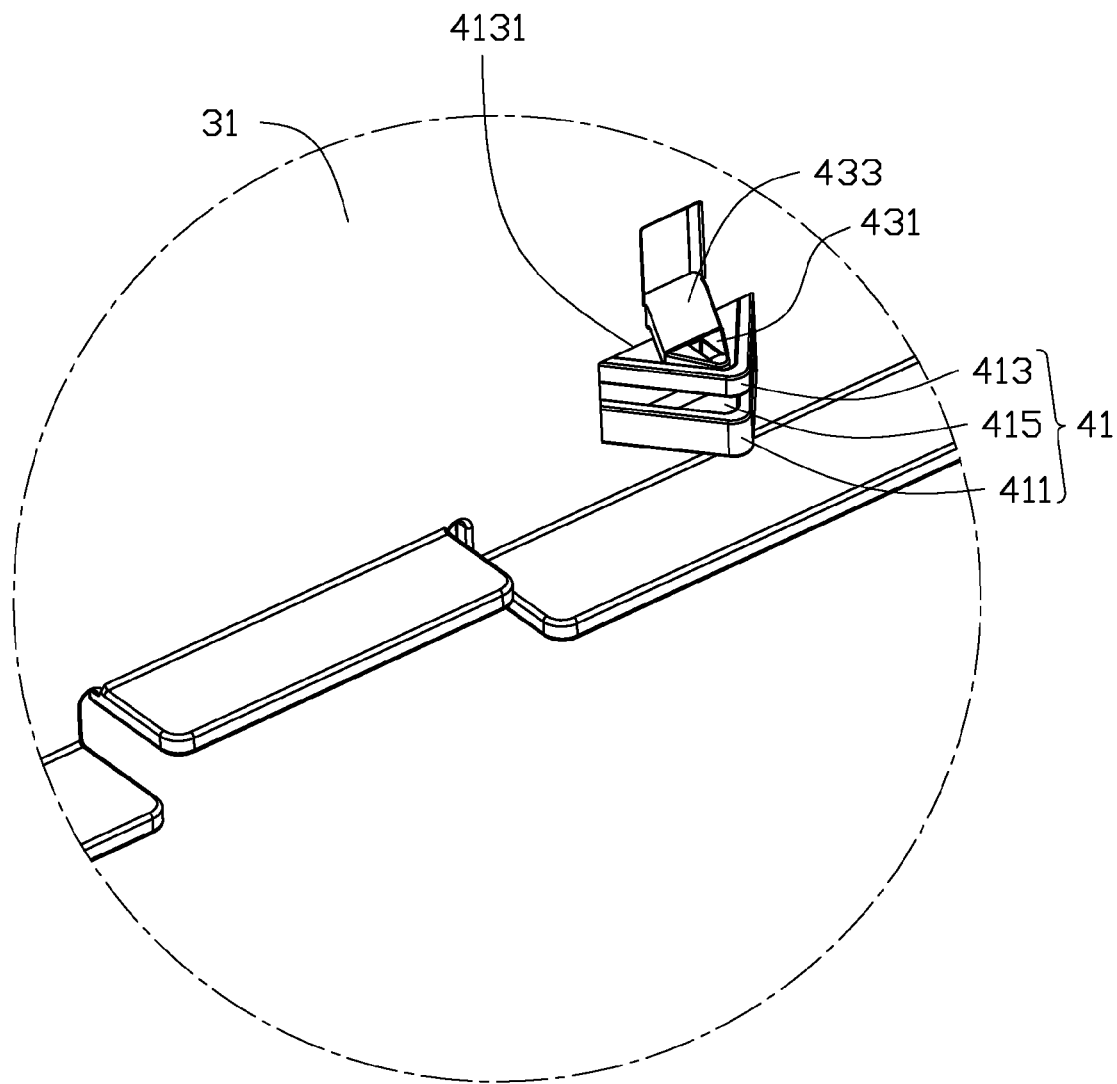
FIG. 2 is an enlarged view of a circled portion II of FIG. 1.

FIG. 2 illustrates the mounting portion 41 and the securing portion 43 attached to the mounting portion 41. The mounting portion 41 includes a first protruding plate 411, a second protruding plate 413 in parallel with the first protruding plate 411, and a positioning portion 415 located between the first protruding plate 411 and the second protruding plate 413. In at least one embodiment, the first protruding plate 411 and the second protruding plate 413 have a triangle configuration and are substantially perpendicular to the first plate 31. The second protruding plate 413 defines an aperture 4131. The positioning portion 415 can receive the circuit board 20. In at least one embodiment, the positioning portion 415 is a notch, and a top surface of the first protruding plate 411 is substantially perpendicular to the first sidewall 31.

Figure 3:
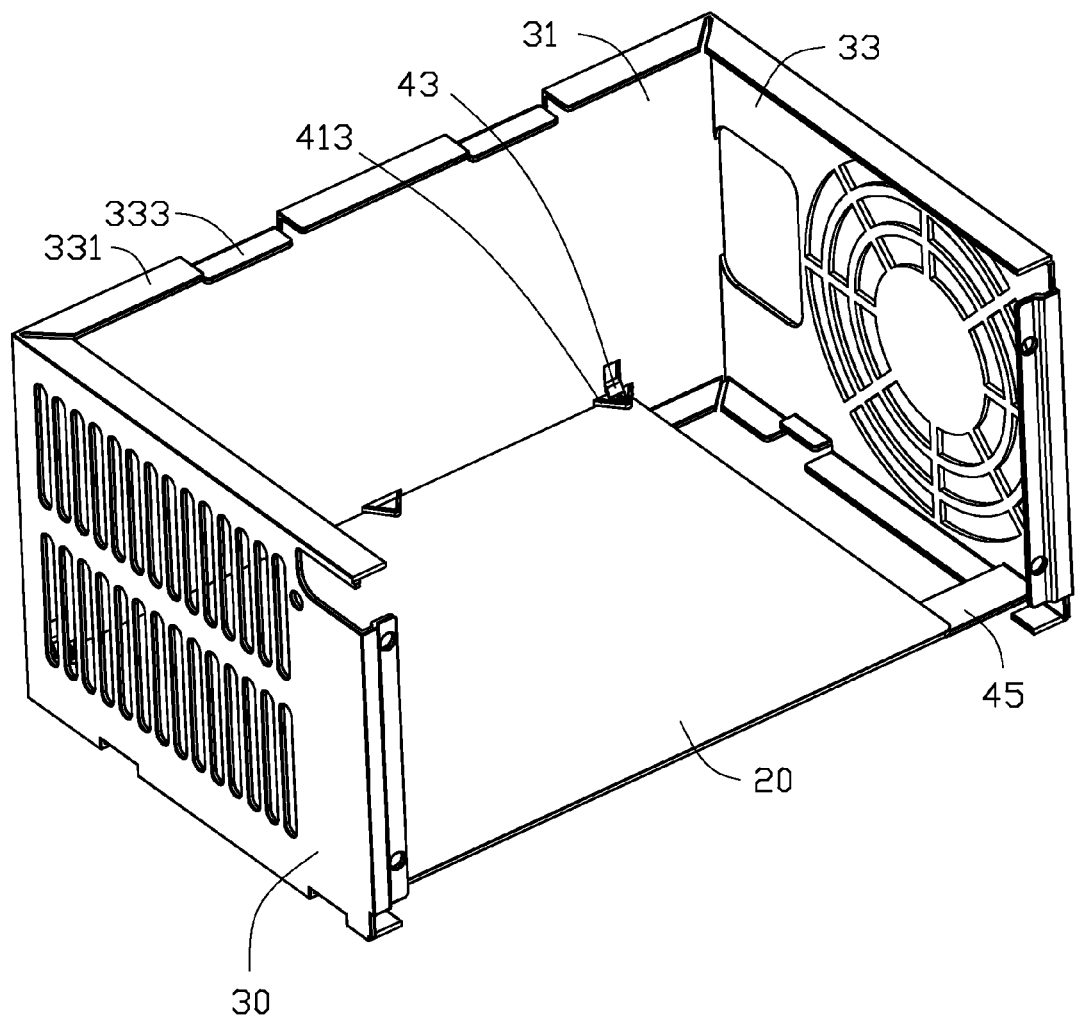
FIG. 3 is an isometric view of a first housing and a circuit board of FIG. 1.

FIG. 3 illustrates an assembly of the first enclosure 30 and the circuit board 20. The circuit board 20 is received in the positioning portion 415, and corporately supported by the first protruding plate 411 and the retaining piece 45.

Figure 4:
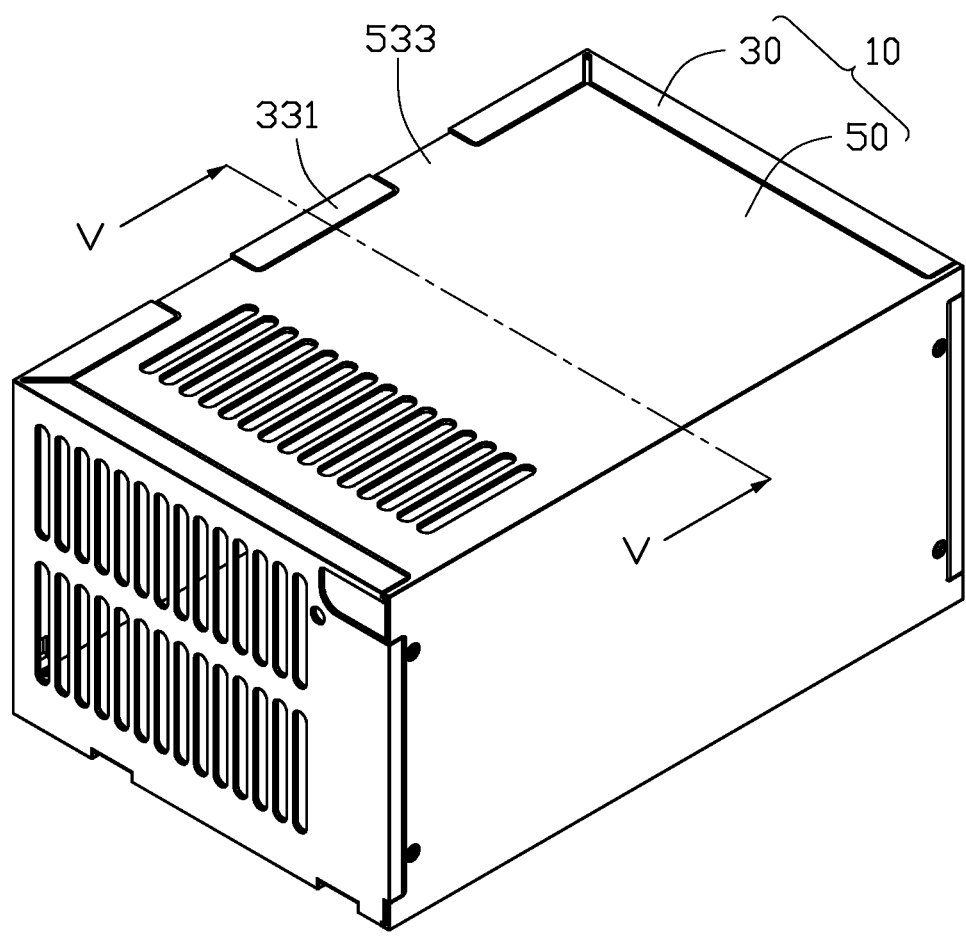
FIG. 4 is an assembled, isometric view of the power supply of FIG. 1.

FIG. 4 illustrates an assembly of the first enclosure 30 and the second enclosure 50. The first flanges 331 are engaged in the upper recesses 531, and the second flanges 333 are engaged in the lower recesses 533.

Figure 5:
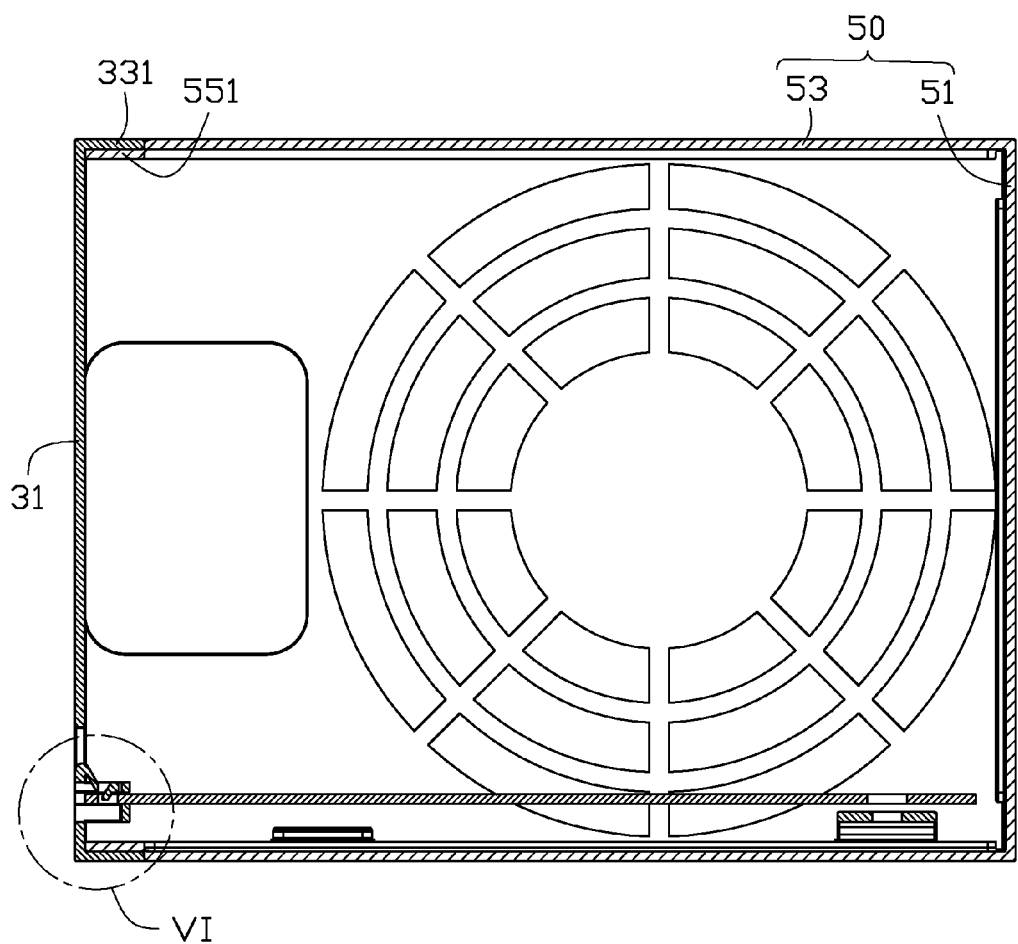
FIG. 5 is a cross-sectional view of FIG. 4, taken along a line V-V.
Figure 6:
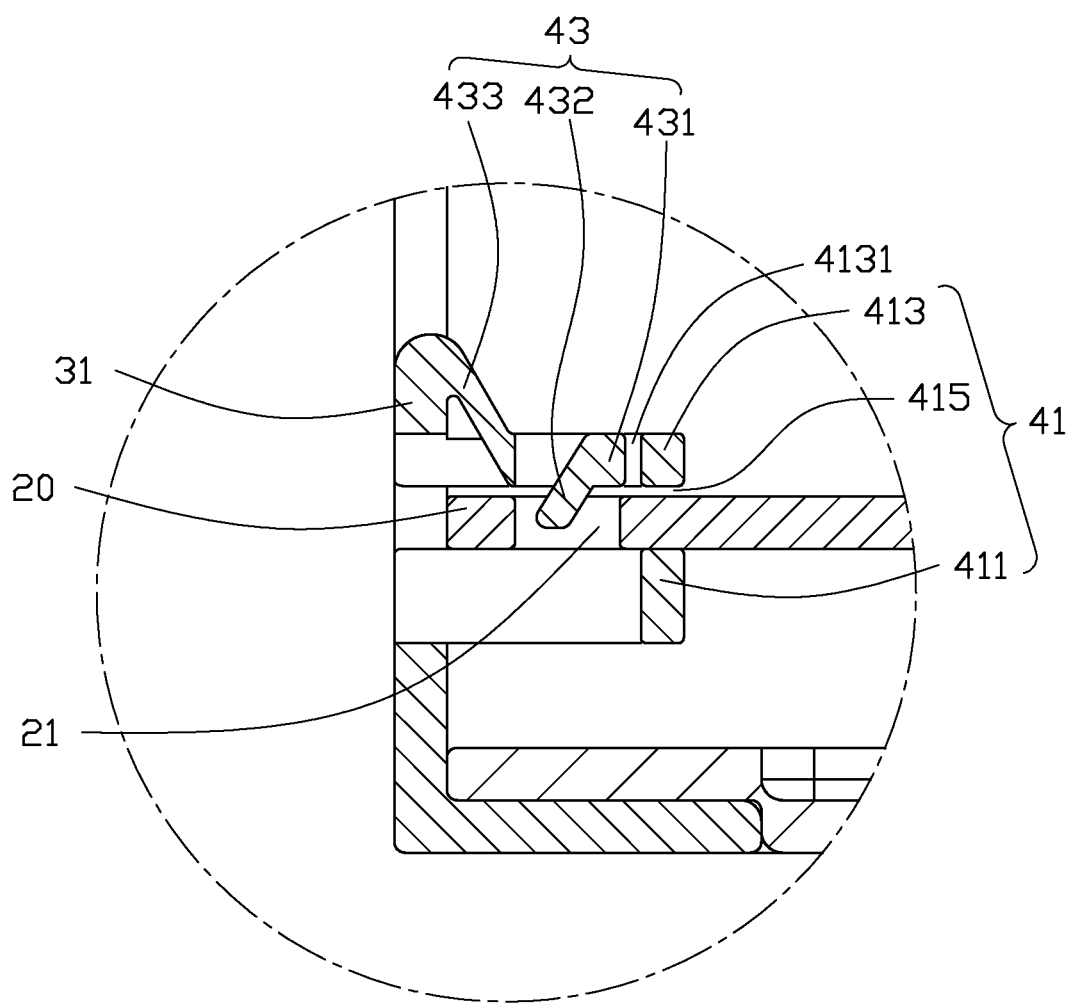
FIG. 6 is an enlarged view of a circled portion VI of FIG. 5.

FIG. 5 and FIG. 6 illustrate the circuit board 20 is received in the positioning portion 415. The securing portion 43 can include a coupling piece 431 and a slanted piece 433. The coupling piece 431 is received in the aperture 4131. The slanted piece 433 interconnects the coupling piece 431 and the first sidewall 31. The coupling piece 431 is substantially parallel with the first protruding plate 411. The securing portion 43 further includes a resilient portion 432 located on the coupling piece 431. An obtuse angle is defined between the resilient portion 432 and the coupling piece 431. In at least one embodiment, the resilient portion 432 is a clipping piece integrated with the coupling piece 431, an obtuse angle is defined between the coupling piece 431 and the slanted piece 433, and a acute angle is defined between the first sidewall 31 and the slanted piece 431. In at least one embodiment, a top surface of the first protruding plate 411 and a top surface of the retaining piece 45 are substantially located on a same horizontal plane.

When the circuit board 20 is to be installed, the circuit board 20 can be moved towards the first sidewall 31 and deform the resilient portion 432 until the resilient portion 5311 is engaged in the securing hole 21, and supported by the retaining piece 45. Thus, the circuit board 20 is mounted in the first enclosure 30. The second enclosure 50 can be moved towards the first enclosure 30 until the first flanges 331 engage in the upper recesses 531 and the second flanges 333 engage in the lower recesses 533. Thus, the power supply chassis 10 is assembled, and the circuit board 20 is installed in the power supply chassis 10. The first panel 51 is substantially parallel with the first sidewall 31, and the second panel 53 is substantially perpendicular to the second sidewall 34.

When the circuit board is to be uninstalled the second enclosure 50 can be drawn away from the first enclosure 30. The first flanges 331 can be disengaged from the upper flanges 531, and the second flanges 333 can be disengaged from the lower flanges 533. The circuit board 20 can be drawn to resist against the resilient portion 432. The resilient portion 432 can be elastically deformed and disengaged from the securing hole 21. Then the circuit board 20 can be detached from the first enclosure 30.

The embodiments shown and described above are only examples. Many details are often found in the art such as the other features of a mounting structure. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A mounting structure for mounting a circuit board in a power supply chassis, the mounting structure comprising:
   a mounting portion located on a first sidewall of the power supply chassis, the mounting portion comprising:
   a first protruding plate configured for supporting the circuit board;
   a second protruding plate in parallel with the first protruding plate; and
   a positioning portion configured for receiving the circuit board and located between the first protruding plate and the second protruding plate;
   a securing portion located on the first sidewall and attached to the mounting portion and comprising a resilient portion extending into the positioning portion for engaging in a securing hole of the circuit board; and
   wherein the second protruding plate defines an aperture, the securing portion further comprises a coupling piece received in the aperture, the resilient portion is located on the coupling piece, and an obtuse angle is defined between the resilient portion and the coupling piece.

2. The mounting structure of claim 1, wherein a top surface of the first protruding plate is substantially perpendicular to the first sidewall.

3. The mounting structure of claim 1, wherein the resilient portion is a clipping piece integrated with the coupling portion.

4. The mounting structure of claim 3, wherein the coupling piece is substantially parallel with the first protruding plate.

5. The mounting structure of claim 1, wherein the securing portion further comprises a slanted piece connecting the coupling piece and the first sidewall, and an obtuse angle is defined between the coupling piece and the slanted piece.

6. The mounting structure of claim 5, wherein a acute angle is defined between the slanted piece and the first sidewall.

7. The mounting structure of claim 1, further comprising a retaining piece for supporting the circuit board, wherein the retaining piece is located on a second sidewall connected to the first sidewall, a top surface of the retaining piece and a top surface of the first protruding plate are on a same horizontal plane.

8. The mounting structure of claim 7, wherein the retaining piece is substantially perpendicular to the second sidewall.

9. A power supply chassis for mounting a circuit board, the power supply chassis comprising:
   a first sidewall;
   a second sidewall connected to the first sidewall;
   a mounting portion comprising:
      a positioning portion;
      a first protruding plate and a second protruding plate in parallel with the first protruding plate, the protruding portion is located between the first protruding plate and the second protruding plate;
   a securing portion located on the first sidewall, the securing portion being attached to the mounting portion and, comprising a resilient portion extending into the positioning portion for engaging in a securing hole of the circuit board;
   a retaining piece attached to the second sidewall, the retaining piece configured for supporting the circuit board; and
   wherein the second protruding plate defines an aperture, the securing portion further comprises a coupling piece received in the aperture, the resilient portion is located on the coupling piece, and an obtuse angle is defined between the resilient portion and the coupling piece.

10. The power supply chassis of claim 9, wherein the positioning portion is a notch.

11. The power supply chassis of claim 9, wherein the retaining piece is substantially perpendicular to the sidewall.

12. The power supply chassis of claim 9, wherein a top surface of the retaining piece and a top surface of the first protruding plate are located on a same horizontal plane.

13. The power supply chassis of claim 9, wherein the securing portion further comprises a slanted piece interconnecting the coupling piece and the first sidewall, an obtuse angle is defined between the coupling piece and the slanted piece, and an acute angle is defined between the slanted piece and the first sidewall.

14. The power supply chassis of claim 9, further comprising a first enclosure and a second enclosure, wherein the first enclosure comprises the first sidewall and the sidewall, a plurality of first securing flanges and second securing flanges are attached to the first sidewall, the second enclosure defines upper recesses corresponding to the first flanges and lower recesses corresponding to the second flanges, when the second enclosure is assembled to the first enclosure, the first flanges are engaged in the upper recesses, and the second flanges are engaged in the lower recesses.

15. The power supply chassis of claim 14, wherein the first flanges are located on a first horizontal plane, the second flanges are located on a second horizontal plane, and the second horizontal plane is lower than the first horizontal plane in a vertical direction.

16. The power supply chassis of claim 15, wherein the second flange is located between two first flanges.

* * * * *